United States Patent [19]
Liu et al.

[11] Patent Number: 5,637,186
[45] Date of Patent: Jun. 10, 1997

[54] METHOD AND MONITOR TESTSITE PATTERN FOR MEASURING CRITICAL DIMENSION OPENINGS

[75] Inventors: Chih-Chiang Liu; Po-Wen Yen, both of Hsin-Chu; Hsi-Hsin Hong, Nan Tow County, all of Taiwan

[73] Assignee: United Microelectronics Corporation, Hsin-Chu, Taiwan

[21] Appl. No.: 561,875

[22] Filed: Nov. 22, 1995

[51] Int. Cl.⁶ ............................................... H01L 21/00
[52] U.S. Cl. ............................. 438/14; 216/56; 216/59; 216/84; 438/671; 438/703
[58] Field of Search ................. 156/626.1, 644.1, 156/657.1, 659.11, 345; 216/56, 59, 79, 84, 99; 437/8

[56] References Cited

FOREIGN PATENT DOCUMENTS

| | | | |
|---|---|---|---|
| 57-40934 | 3/1982 | Japan | 156/626.1 |
| 58-180027 | 10/1983 | Japan | 156/626.1 |

*Primary Examiner*—William Powell
*Attorney, Agent, or Firm*—William H. Wright

[57] ABSTRACT

A process and a monitor structure to measure semiconductor device dimensions, especially contact and via hole dimensions, and proximity effects. The monitor has structures and layers which match the thickness and configuration of the product devices and allow measurement of step heights and proximity measurements. The monitor pattern includes an alignment region for use with automeasurement equipment. Measurements of openings are performed on the monitor at various points during the fabrication process.

23 Claims, 6 Drawing Sheets

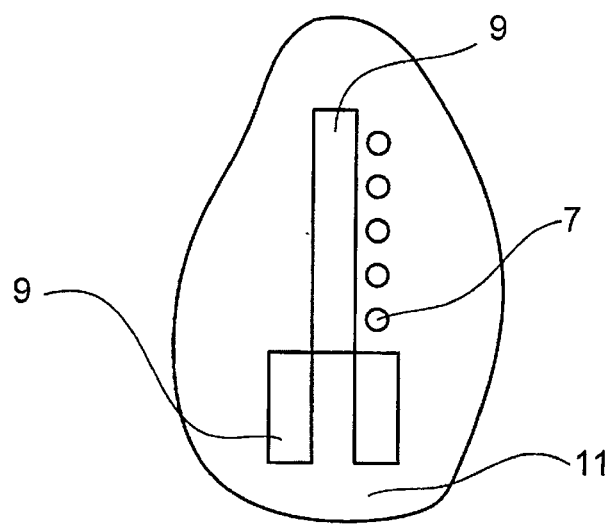
FIG. 1 - Prior Art
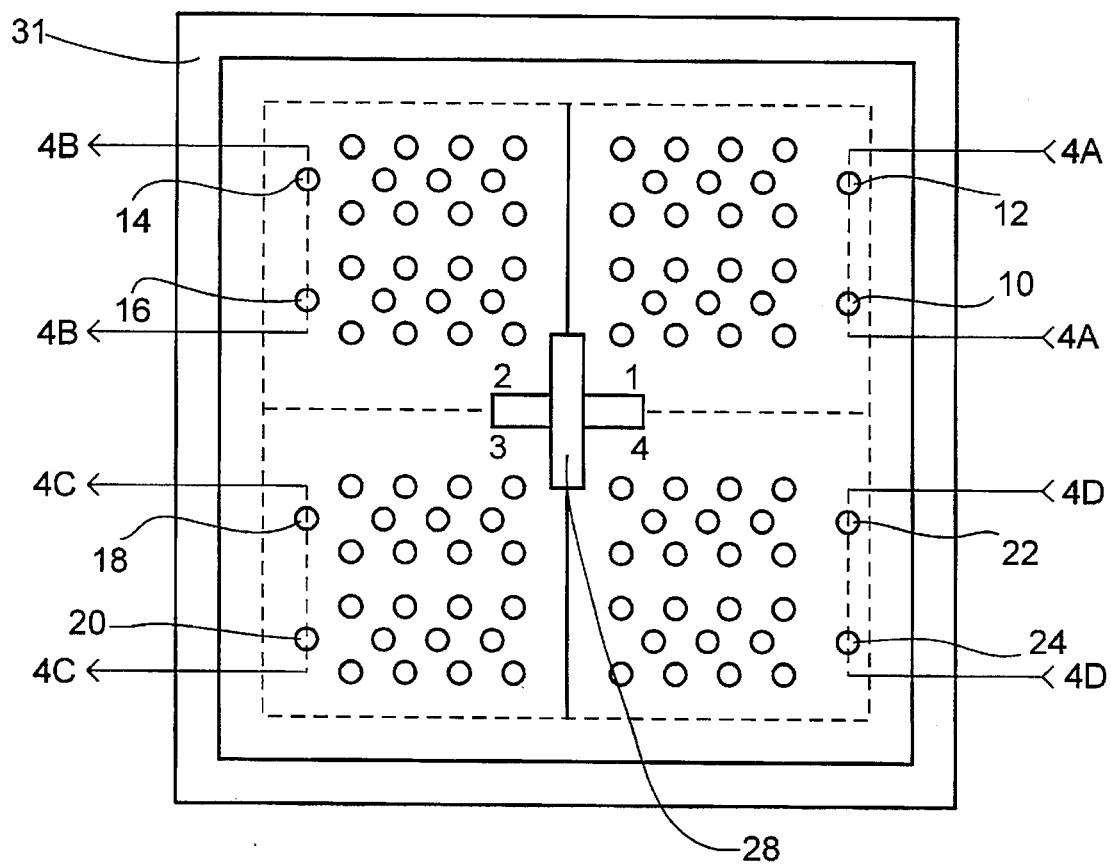
FIG. 2A

METHOD AND MONITOR TESTSITE PATTERN FOR MEASURING CRITICAL DIMENSION OPENINGS

BACKGROUND OF THE INVENTION

1) Field of the Invention

The present invention relates to methods and devices for fabricating semiconductor devices and more particularly a method and a device for monitoring the dimensions of submicron photoresist patterns, contact openings, and metal via openings.

2) Description of the Prior Art

In recent years contact openings and metal via openings have become smaller and have reached submicron sizes. The processes to fabricate these structures have become complex and expensive. Moreover, several device parameters must be measured and monitored to ensure that the photolithography processes are run properly and that product devices are correct. These measurements include hole dimensions, step heights, and proximity effects in cells. Hole dimensions are measured to monitor the photo mask quality, exposure times, photoresist quality and other process variables. Step height is the difference in heights of different layers, for example, the height difference between the substrate surface and the top of a field oxide region. It is important to measure step heights since large step heights cause subsequent overlying conductive layers to have "step coverage" problems. These step coverage problems occur where the overlying conductive layer thins or breaks as it crosses over from a thick to a thin underlying layer boundary. Proximity effects are scattered electron beams that adjacent pattern elements receive from other closely spaced pattern elements. As a result of the proximity effects, it is necessary to adjust exposure time for various classes of elements by pattern density.

The monitor patterns and monitor test sites currently used to monitor semiconductor device dimensions have several deficiencies that do not allow optimal measurements to be taken. FIG. 1 shows a top down view of a typical monitor pattern. Hole patterns 7 and line patterns 9 are formed in layers 11 of the substrate surface. The current monitor patterns do not allow accurate measurements of step heights. Also, proximity effects in cells can not be accurately measured on the present monitor test sites because the monitor test sites do not include structures which precisely replicate the variations in pattern spacings in actual devices. Moreover, the current test monitor is difficult to use with automatic measurement equipment because the present monitor sites do not contain targets large enough for the automatic measuring equipment to align to.

In order to obtain some critical dimension measurements, manufacturing operators attempt to make measurements on device cells. Unfortunately, because of the small device size and complex pattern, the operator's manual measurements of device cells lead to errors. The manual measurements are also time consuming. Moreover, it is not possible to make some manual measurements, e.g., hole dimensions and different height steps, on actual devices because the devices are have been reduced to sub micron sizes.

There is a need to develop a new monitor pattern which will overcome these problems. The monitor pattern should allow easy step height and hole dimension measurements in addition to including areas for measuring proximity effects. Automeasurement tools should be able to make measurements on the new monitor patterns.

SUMMARY OF THE INVENTION

It is an object of this invention to provide a method and a device to monitor the critical opening dimensions, step heights, and proximity effects of submicron devices, especially on contact holes and via openings.

It is another object of this invention to provide a monitor which accurately represents product device spacing and density on which accurately proximity measurements can be made.

It is a further object of this invention to provide a method and a structure on which automatic measuring equipment can be used to measure the hole dimensions and step heights of submicron devices.

In the method of the present invention for measuring parameters using a monitor, the monitor comprises a first, second, third, and fourth monitor areas on a substrate, a border zone surrounding the monitor areas, and an alignment region between the monitor areas. The monitor is formed concurrently with other device chips on a semiconductor wafer. That is, the same process steps are performed simultaneously on both the device chips and the monitor. The method begins by forming a pad oxide layer and a silicon nitride layer on the substrate surface. A field oxide layer is formed in the second and third areas on the substrate surface. Next, a tungsten silicide layer is formed on the third and fourth areas and in the border zone. A first oxide layer is then formed on the substrate surface. A third photoresist layer is formed on the substrate surface, the third photoresist layer having a plurality of contact openings in all four areas and an alignment opening in the alignment region. Subsequently, pattern measurements are taken in the monitor areas. The first oxide layer is then etched through the third photoresist layer forming contact holes in all four areas and the first oxide layer in the alignment region is etched forming an alignment contact opening. Afterwards, pattern measurements are taken on the openings in the monitor areas. A metal layer and a second oxide layer are formed on the substrate surface. A fifth photoresist layer is formed on the substrate surface, the fifth photoresist layer having via openings in all four areas, and openings in the border zone and in the alignment region. The monitor patterns are then measured. Vias in the metal layer in all four areas are etched. Again, pattern measurements are made or the vias in the monitor areas.

The monitor site includes structures which simulate device structures so that critical measurements can be taken on the monitor site structures and correlated to the device structures. Hole with wide and narrow spacings to adjacent holds are included in the monitor areas to measure proximity effects. An auto alignment target is included in the alignment regions to allow auto measurement tools to align with the monitor pattern.

BRIEF DESCRIPTION OF THE DRAWINGS

The drawings show the following:

FIG. 1 is a top plan view in greatly enlarged scale that illustrates a monitor pattern of the prior art.

FIG. 2A is a top plan view in greatly enlarged scale that illustrates a preferred embodiment of the monitor pattern of the present invention.

DETAILED DESCRIPTION OF THE PREFERRED EMBODIMENTS

According to the present invention, a structure for a monitor pattern and a process for measuring critical dimensions on the monitor site is disclosed. More particularly, a method and device (monitor site/monitor pattern) are described for measuring hole dimensions, step height dimensions, and proximity effects for submicron semiconductor devices using the monitor site. The monitor occupies a space on a semiconductor wafer along with other device chips. The same process steps are performed simultaneously on the device chips and the monitor. The method includes fabricating a process layer monitor structure for each process layer which simulates device step height and structure. The monitor site includes structures which simulate device structures so that critical measurements can be taken on the monitor site structures and correlated to the device structures. Holes with wide and narrow spacings to adjacent holds are included in the monitor areas 1 2 3 4 to measure proximity effects. An alignment region 28, preferably a cross-shaped pattern, is used to allow automatic alignment and measurement by a test equipment.

The monitor patterns are located on various locations around the wafer to measure variations across the wafer. While a preferred embodiment of the monitor site of the invention is described below including 4 monitor areas and approximately four layers, in practice the monitor site can include any number of monitor areas and any number of layers. The monitor normally will include the layers of product devices being fabricated.

Figure 3A:
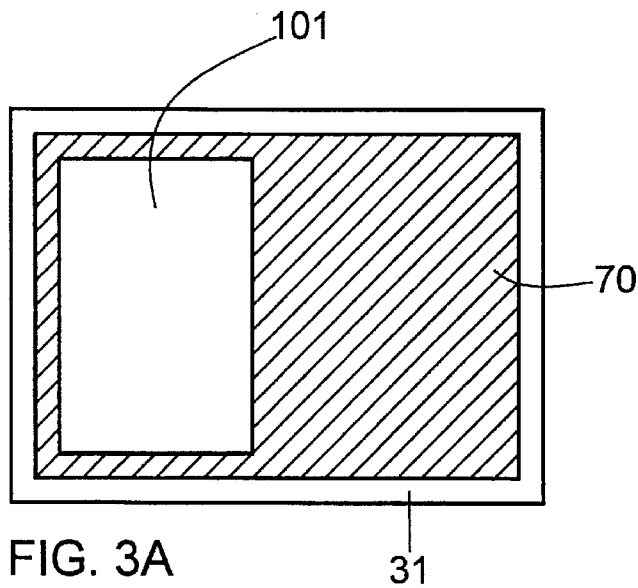
FIGS. 3A through 3E show top plan views of the photoresist layers overlying the monitor areas on the substrate used in the preferred process of the present invention in different levels of fabrication.
Figure 3B:
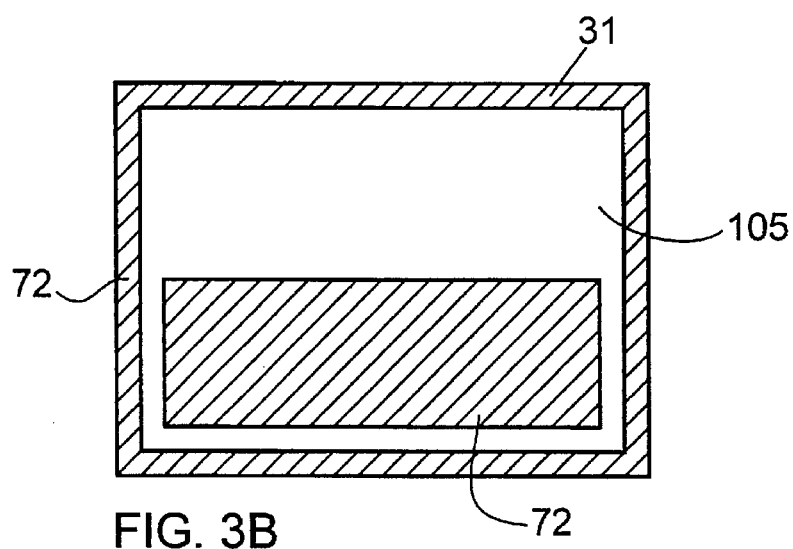
Figure 3C:
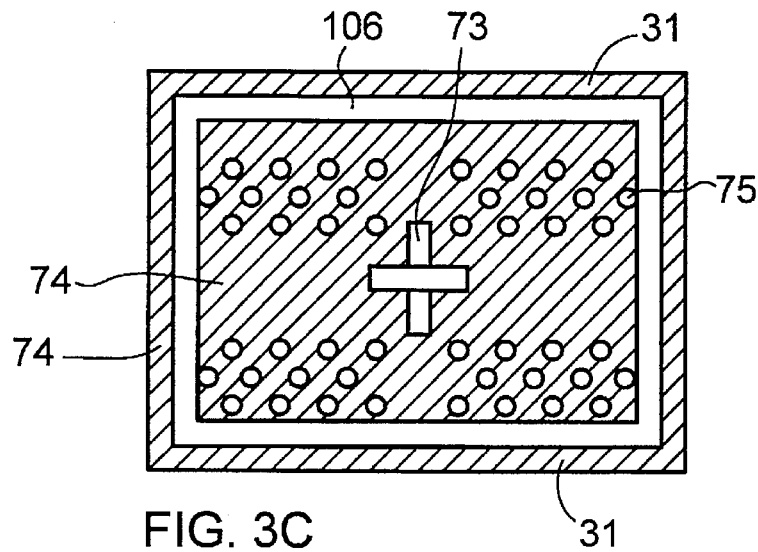
Figure 3D:
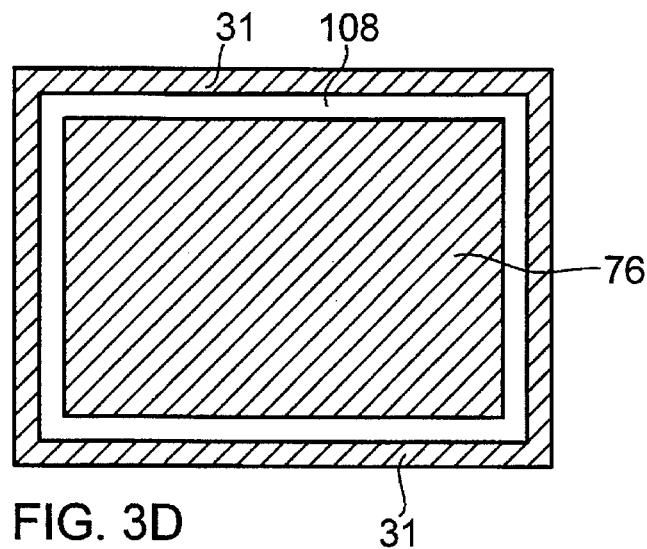
Figure 3E:
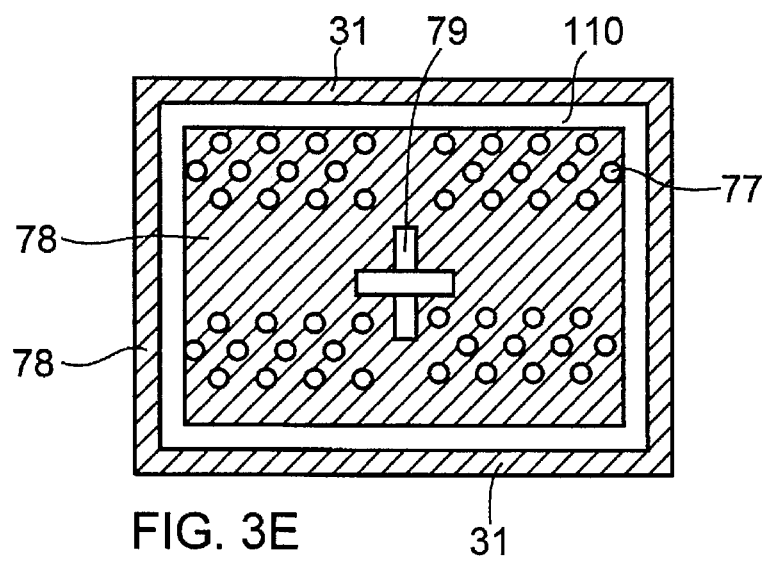
Figure 4A:
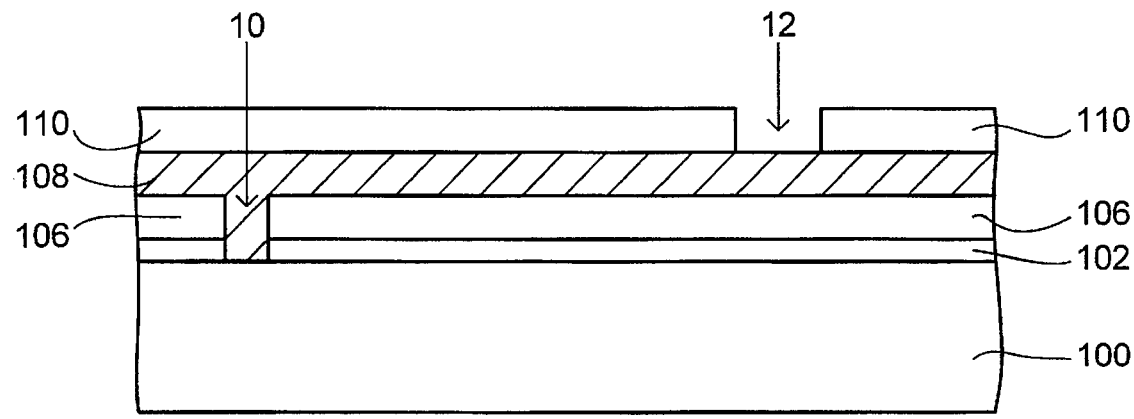
FIGS. 4A through 4D show a cross-sectional view in broken section in greatly enlarged scale that illustrates a structure of the monitor pattern site of the present invention along the axes labeled 4A through 4D which are shown in FIG. 2A.
Figure 4B:
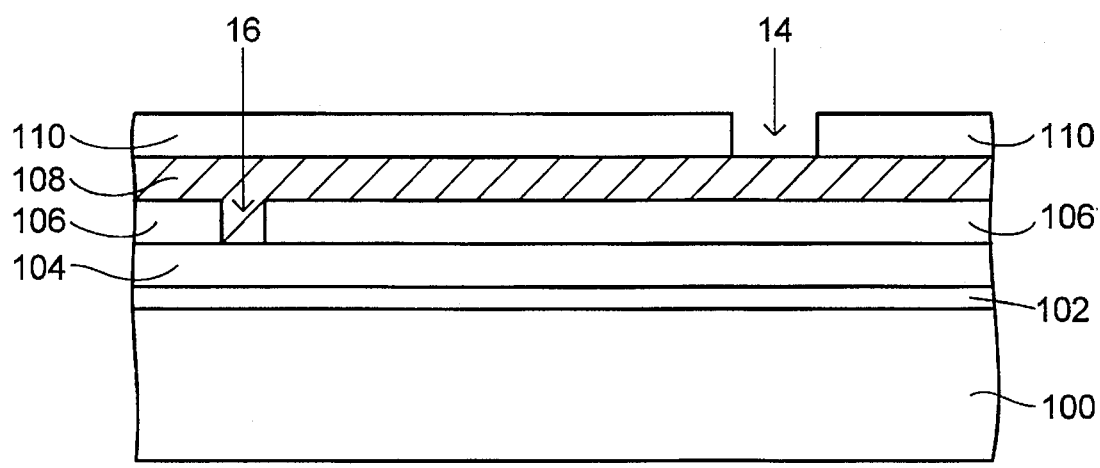
Figure 4C:
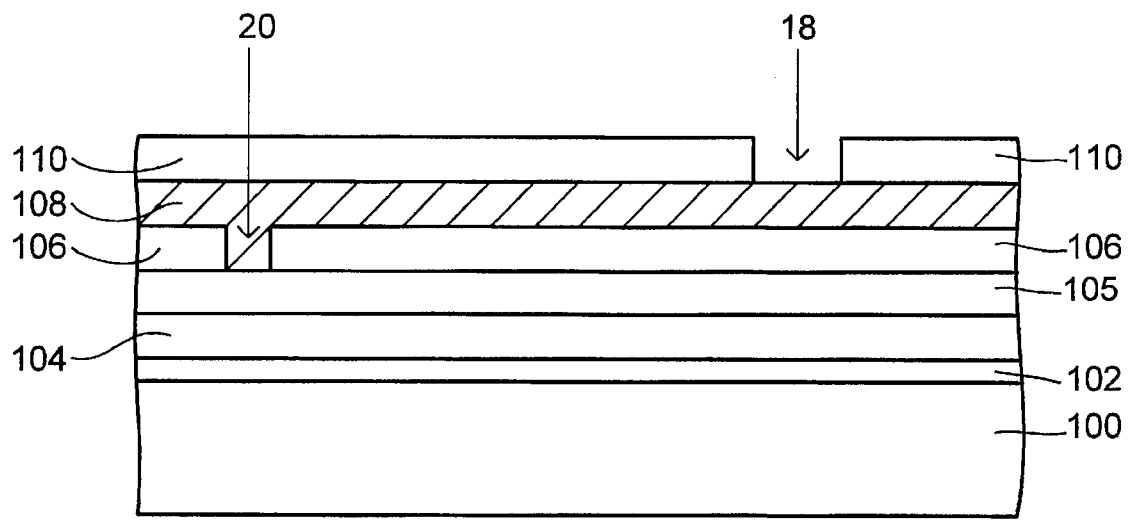
Figure 4D:
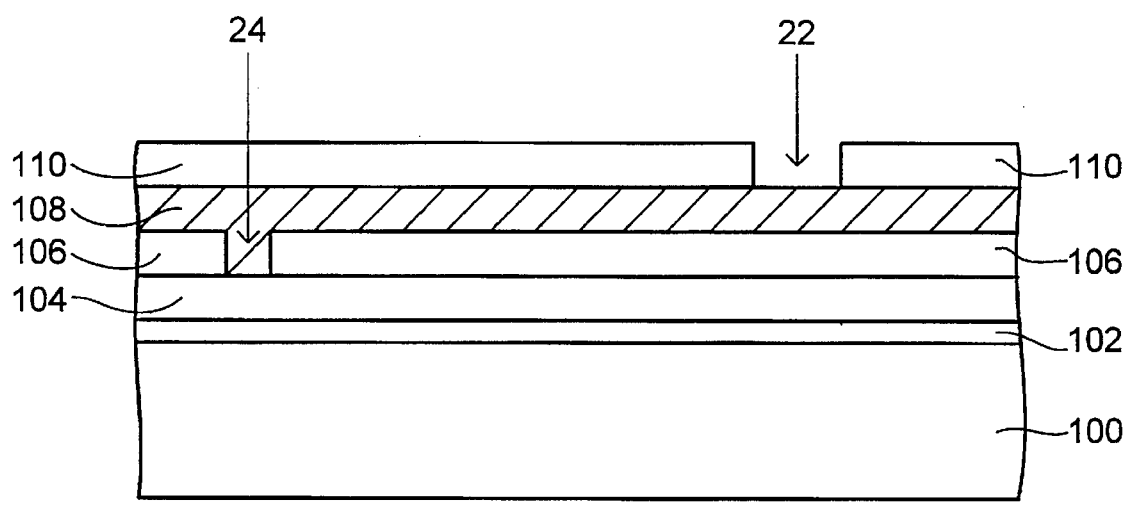
Figure 5:
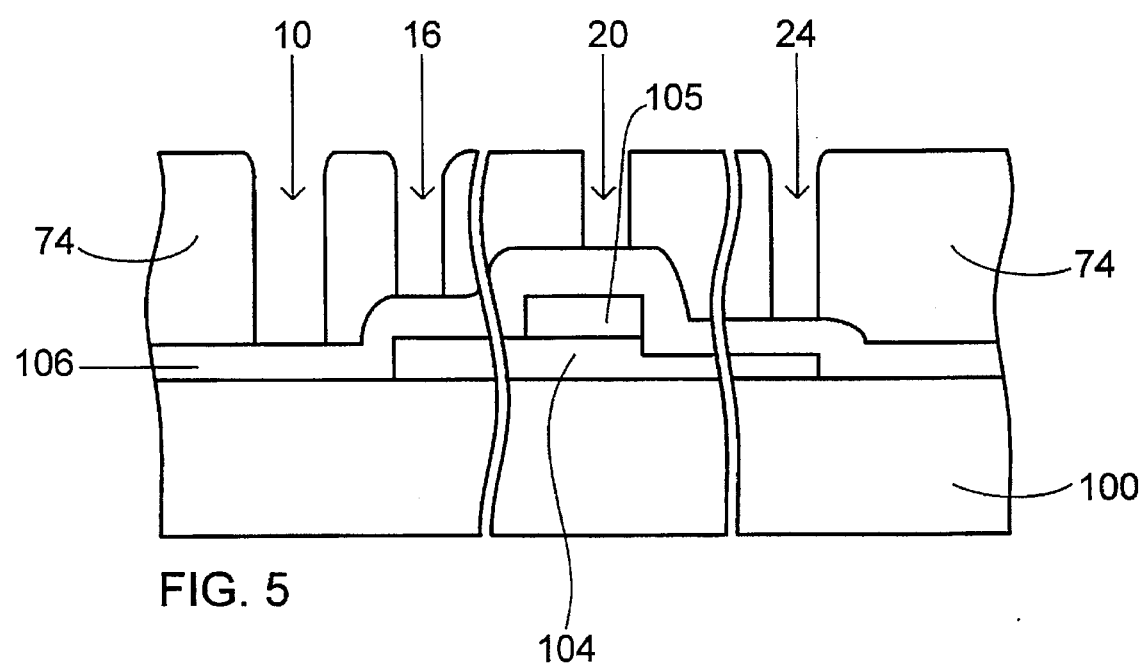
FIG. 5 shows a cross-sectional view in broken section in greatly enlarged scale that illustrates a structure of the monitor pattern site of the present invention at the fabrication step of the first measurement point.

The invention is described below with reference to FIGS. 2A through 4D. The preferred embodiment of the monitor site is shown in FIG. 2A. The top plan view of the photoresist layers used in fabrication are shown in FIGS. 3A through 3E. The hatched areas represent areas which have a photoresist layer and the white areas the exposed substrate surface. The process and resulting structures for each of the four monitor areas of the monitor site are illustrated on FIGS. 4A through 4D. FIG. 4A represents the first monitor area 1 in FIG. A. FIG. 4B represents the second monitor area 2 in FIG. 1. FIG. 4C represents the third monitor area 3 in FIG. 2A. Similarly, FIG. 4D represents the fourth monitor area 4 in FIG. 2A.

As shown in FIGS. 2A, 4A–4D, in a preferred method for measuring parameters for submicron semiconductors using a monitor, the monitor has a first, second, third, and fourth monitor areas 1 2 3 4 on a substrate 100, a border zone 31 surrounding the monitor areas, and an alignment region 28 between the monitor areas as shown on FIG. 2A. The term substrate is meant to include the semiconductor wafer, the layers on a semiconductor wafer and devices underlying the wafer surface. The term substrate surface is meant to include the outermost exposed layer overlying the wafer. The processes used to form the layers of the monitor are the same processes used to fabricate the semiconductor devices also located on the substrate.

A preferred method begins by forming a pad oxide layer 102 on the substrate surface 100. As illustrated in FIG. 2A, 4A–4D, the pad oxide can have a thickness in the range of 150 to 400 Å. Next, a silicon nitride layer is formed on the substrate surface. Silicon nitride layer can have a thickness in the range of 1000 to 1500 Å. Silicon nitride layer can be formed by any process used in fabricating the semiconductor devices, such as a conventional LPCVD process where dichlorosilane and ammonia are reacted at reduced pressure at approximately 700° C.

A first blanket photoresist layer is formed on the substrate. The blanket photoresist layer is exposed, developed, and etched to form a first photoresist layer. A first photoresist layer 70 is formed on the substrate surface. The first photoresist layer covering the first and fourth areas 1 4 and the border zone 31 as shown in FIGS. 2A and 3A.

The silicon nitride layer 101 in the first and fourth areas 1 4 and border zone is etched using the first photoresist layer 70 as a mask as shown in FIG. 3. Afterwards, the first photoresist layer is removed.

A field oxide layer 104 is formed in the second and third areas 2 3 on the substrate surface using the remaining silicon nitride layer as a diffusion mask as shown in FIGS. 4B and 4C. The remaining silicon nitride layer 101 is then removed.

A tungsten silicide layer 105 is then formed on the substrate surface. The tungsten silicide layer 105 can be formed conventionally in two steps, that is, a polysilicon layer is formed and then a tungsten silicide layer. The polysilicon layer can have a thickness of approximately 1500 Å and the tungsten silicide layer can have a thickness in the range of 1500 to 2000 Å. Next, a second photoresist layer 72 is formed on the substrate surface. The second photoresist layer 72 covers the third and fourth areas 3 4 and the border zone 31 as shown in FIGS. 3B, 4A–4D. The tungsten silicide layer 105 is etched in the exposed first and second areas 1 2 using the second photoresist layer 72 as a mask leaving tungsten silicide (TiSi$_x$) in the third and fourth areas and the border zone. The second photoresist layer is removed thereafter as shown in FIGS. 4A through 4D.

A first oxide layer 106 is formed on the substrate surface. Oxide layer will be referred to as insulating layers. Oxide layers can be formed by conventional processes such as a thermal oxidation process. A third photoresist layer 74 is formed on the substrate surface The third photoresist layer has a plurality of contact openings 75 in all four areas and an alignment opening 73 in the alignment region as shown in FIG. 3C.

Now measurements, called after development inspection measurements (ADI), are taken on sites 10, 16, 20, 24, as shown in FIGS. 4A–4D and 5. The auto alignment zones 28 in the monitor are used to align the test machine with the monitoring sites. These measurement can include hole dimensions, step height measurements and proximity effect measurements.

Next, the first oxide layer 106 is etched using the third photoresist layer 74 as a mask forming contact holes 10 16 20 24 in all four areas 1 2 3 4 in the first oxide layer 106 and in the alignment region forming an alignment contact opening 73. The third photoresist layer 74 is then removed.

Now, measurements called "after etching inspection" measurements (AEI) are taken of the contact openings in the first oxide layer 106. The auto alignment zones in the monitor are used to align the test machine with the monitoring sites. These measurement include hole dimensions, step height measurements and proximity effect measurements.

A metal layer 108 is then formed on the substrate surface. A fourth photoresist layer 76 is formed on the all four areas and the alignment region as shown in FIG. 3D. The metal layer 108 is etched from around the border zone 31 using the fourth photoresist layer 76 as a mask. The fourth photoresist layer 76 is removed.

A second oxide layer 110 is formed on the substrate surface. A fifth photoresist layer 78 is formed on the substrate surface. The fifth photoresist layer 78 has via openings in all four areas, and openings in the border zone and in the alignment region as shown in top plan view FIG. 3E.

Now, after development inspection measurements (ADI) again are taken in the photoresist via openings 77. The auto alignment zones 28 in the monitor are used to align the test machine with the monitoring sites.

Figure 2B:
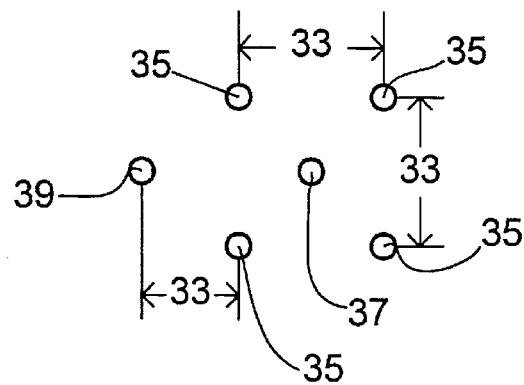
FIG. 2B is a top plan view in greatly enlarged scale that illustrates the openings shown in FIG. 2A.

As shown in top plan view FIGS. 2A and 2B, insulating layers and photoresist layers in the monitor areas contain variable spaced holes 35 37 39 which allow the measurement of proximity effects. Proximity effect is the adjacent pattern elements receiving of scattered electron beams from other closely spaced pattern elements. Proximity effects can be measured by comparing the differences between hole dimensions of closely spaced hole and isolated (widely spaced) holes. The preferred hole arrangement shown in shown in FIG. 2B allows for measurements to be take on closely spaced holes 37 to 35 and standard spaced holes 39. Hole 37 represents a relatively densely spaced hole while hole 39 represents a relatively isolated hole. FIG. 2B is an enlarged view of the hole arrangement, such as holes 16, in FIG. 2A. The spacing 33 between holes 35 can be approximately 5 µm for the current photolithography technology.

Next, the second oxide layer 110 is etched through the fifth photoresist layer 78 forming vias 12 14 18 22 in the oxide layer 110 in all four areas and removing the second oxide layer in the border zone and alignment region. The fifth photoresist layer 78 is then removed.

Measurements called after etching inspection (AEI) measurements are then taken of the vias. The auto alignment zones 28 in the monitor are used to align the test machine with the monitoring sites.

The structure of a monitor for measuring process variables during a semiconductor process is described. The monitor includes a first, second, third, and fourth monitor areas 1 2 3 4, a border zone 31 surrounding the monitor areas, and an alignment region 28 between the monitor areas as shown in FIGS. 2A, 4A through 4D. The alignment region 28 can be cross shaped as shown in FIG. 2A. The alignment region is shaped to be recognizable to an auto measuring tool, an appropriate shape being the cross shape among other shapes.

As shown in FIGS. 2A and 4A, the monitor first monitor area 1 includes a pad oxide layer 102 and a first oxide layer 104 that overlie the substrate 100. The pad oxide 102 and the first oxide layer 106 have a plurality of first contact holes 10 through the pad oxide and first oxide layers. The first contact holes 10 preferably have a diameter less than 1 µm. A metal layer 108 covers the first oxide layer 106 and fills first contact holes 10. A second oxide (insulating) layer 110 with a plurality of first vias 12 overlies the metal layer 108.

As shown in FIGS. 2A and 4B, the second monitor area 2 includes a pad oxide layer 102, and a field oxide layer 104 that overlie the substrate 100. Next, a first oxide layer 106 containing a plurality of second contact holes 16 that overlie the field oxide layer. A metal layer 108 covers the first oxide layer 106 and fills the plurality of second contact holes 16. A second oxide layer 110 overlies the metal layer, the second oxide layer 110 having a plurality of second vias 14.

The monitor also includes a third monitor area 3 wherein the substrate 100 is covered with a pad oxide layer 102, a field oxide layer 104, a tungsten silicide layer 105, and first oxide layer 106 as shown in FIGS. 2A and 4C. The first oxide layer 106 has a plurality of third contact holes 20. The tungsten silicide layer may include a polysilicon layer. The metal layer 108 overlies the first oxide layer 106 and fills the third contact holes 24. A second oxide layer 110 having a plurality of third vias 18 overlies the metal layer 108.

The fourth monitor area 4 includes a pad oxide layer 102, a tungsten silicide layer 105 and first oxide layer 106 that overlie the substrate 100 as shown in FIG. 2A and FIG. 4D. The first oxide layer 106 has a plurality of fourth contact holes 24. The tungsten silicide layer 105 may include a polysilicon layer. A metal layer 108 overlies the first oxide layer, the metal filing the fourth contact holes 24. The second oxide layer 110 having a plurality of fourth vias 22 covers the metal layer. The contact holes and vias preferably have a diameter of less than 1 µm.

In practice, the monitor site of the present invention can have any number of monitor areas. Four areas are described above for illustration only. Also, the number of films can be varied and the order and arrangement of films can be changed to fit the process of the actual product devices. In particular, the monitor site could have only one site and be composed of a minimum number of layers.

The monitor can be designed in at least two types of pattern spacings: isolated and dense as shown in FIGS. 2A and 2b. These different design styles which have varied spacing between elements are used to measure proximity effects. The isolated hole 39 pattern preferably has a spacing between contact hole 39 and the nearest adjacent hole of approximately 5 µm as shown in FIG. 2B. The preferred spacing between the dense holes 37 and the adjacent holes 35 is in the range of 3.5 µm.

The monitor of the present invention is smaller than prior art monitors and takes up less space on the wafer. The monitor pattern of the present invention has area of 51 µm by 51 µm which allows the new monitor pattern to fit into chip scribe area which are typically in the range of 100 to 120 µm wide.

The monitor process of the current invention allows contact hole and via critical dimensions, and step height measurements to be made which represent the actual product photo dimensions and structures. The monitor can measure proximity effects because the contact openings and via pattern styles that have narrow and wide spacing.

While the invention has been particularly shown and described with reference to the preferred embodiments thereof, it will be understood by those skilled in the art that various changes in form and details may be made without departing from the spirit and scope of the invention.

What is claimed is:

1. A method for fabricating and using a monitor pattern during the fabrication of semiconductor devices on the surface of a semiconductor substrate, the monitor pattern comprising at least a first monitor area, the method comprising the steps of:

forming a first insulating layer on the substrate surface, applying, exposing, and developing a first photoresist layer on said first insulating layer, said first photoresist layer having first photoresist openings in said first monitor area, measuring the dimensions of said first photoresist openings, removing said first photoresist layer, etching said first insulating layer using said first photoresist layer as a mask forming first insulating layer openings, and measuring the dimensions of the first insulating layer openings.

2. The method of claim 1 wherein the method further includes forming a first metal layer over said first insulating layer and in the first insulating layer openings, forming a second insulating layer over the first metal layer, applying, developing, and etching a second photoresist layer over the second insulating layer, the second insulating having second photoresist openings in at least the first monitor area, measuring the dimensions of the second photoresist openings, removing the second photoresist layer, etching the second insulating layer using the second photoresist layer as a mask forming second insulating layer openings in at least the first monitor area, and measuring the dimensions of the second insulating layer openings.

3. The method of claim 2 wherein the monitor pattern includes at least a second monitor area, forming a field oxide region beneath the first insulating layer in said second monitor area, and applying the same subsequent fabrication steps as used in the first monitor area.

4. The method of claim 2 wherein the monitor pattern includes a third monitor area;

forming a field oxide layer in the substrate in said third monitor area;

forming a polycide layer overlying the field oxide layer, the polycide layer underlying the first insulating layer; and applying the same subsequent fabrication steps as used in the first monitor area.

5. The method of claim 2 wherein the monitor pattern includes a fourth monitor area and forming a polycide layer on the substrate surface in said fourth monitor area, the polycide layer underlying the first insulating layer and applying the same subsequent fabrication steps as used in the first monitor area.

6. The method of claim 1 wherein the monitor pattern further comprises forming a pad oxide prior to forming the first insulating layer on the substrate.

7. The method of claim 1 wherein the monitor pattern further comprises forming a border around the monitor areas.

8. The method of claim 1 wherein the monitor pattern further comprise an alignment region which can be used by an automatic measuring machine.

9. The method of claim 1 wherein forming the first photoresist openings and first insulating layer openings including at least one closely spaced opening and at least one isolated opening whereby proximity effects can be measured on the openings.

10. The method of claim 9 wherein said densely packed opening has a spacing between adjacent holes of approximately 3.5 µm and said isolated opening has a spacing between adjacent holes of approximately 5 µm.

11. The method of claim 2 wherein forming the second photoresist openings and second insulating layer openings with closely spaced openings and at least one isolated opening whereby proximity effects can be measured on the openings.

12. The method of claim 11 wherein said closely spaced openings have a spacing between adjacent holes of approximately 3.5 µm and said isolated opening has a spacing between adjacent holes of approximately 5 µm.

13. The method for measuring parameters for submicron semiconductors using a monitor, the monitor having a first, second, third, and fourth monitor areas on the monitor, a border zone surrounding the monitor areas, and an alignment region between the monitor areas, the method comprising the steps of:

forming a pad oxide layer on the substrate surface, forming a silicon nitride layer on the substrate surface, forming a first photoresist layer on the substrate surface, the first photoresist layer covering said first and fourth areas and said border zone, etching the silicon nitride layer in said first and fourth areas and border zone using the first photoresist layer as a mask, removing the first photoresist layer, forming a field oxide layer in said second and third areas on the substrate surface, removing said silicon nitride layer, forming a tungsten silicide layer on the substrate surface, forming a second photoresist layer on the substrate surface, the second photoresist layer covering said third and fourth areas and said border zone, etching the tungsten silicide layer in the first and second areas and border zone using the second photoresist layer as a mask, leaving the tungsten silicide layer in said third and fourth areas and said border zone, removing the second photoresist layer, forming a first oxide layer on the substrate surface, forming a third photoresist layer on the substrate surface, the third photoresist layer having a plurality of photoresist contact openings in all four areas and an alignment opening in the alignment region, making measurements of the contact openings, etching the first oxide layer through the third photoresist layer forming contact holes in all four areas in the first oxide layer and etching the first oxide layer in the alignment region forming an alignment contact opening in said first oxide layer using the third photoresist layer as a mask, removing the third photoresist layer, making measurement on the contact openings in said first oxide layer, forming a metal layer on the substrate surface, forming a fourth photoresist layer on the all four areas and the alignment region, etching the metal layer from the border zone using the fourth photoresist layer as a mask, removing the fourth photoresist layer, forming a second oxide layer on the substrate surface, forming a fifth photoresist layer on the substrate surface, the fifth photoresist layer having via openings in all four areas, and openings in the border zone and in the alignment region, making measurements of the via openings, etching the second oxide layer through the fifth photoresist layer forming vias holes in the metal layer in all four areas, and removing the second oxide layer in the border zone and alignment region, removing the fifth photoresist layer, and making measurements of the via holes.

14. The method of claim 13 wherein the alignment region is cross shaped.

15. The method of claim 13 wherein forming the contact openings and via openings with at least one densely spaced opening and at least one isolated opening whereby proximity effects can be measured on the openings.

16. A monitor pattern for measuring process variables during a semiconductor manufacturing process, the monitor pattern having at least a first monitor area on a substrate, a border zone surrounding the monitor area, and an alignment region, the monitor comprising:

a first monitor area wherein a pad oxide layer and a first insulating layer overlie the substrate, said pad oxide and said first insulating layer having first contact holes through said pad oxide and first insulating layers, a metal layer covering the first insulating layer and filling first contact holes, and a second insulating layer over said metal layer, said second insulating layer having first vias exposing said metal layer.

17. The monitor pattern of claim 16 wherein the monitor pattern further comprises a second monitor area wherein a pad oxide layer, a field oxide layer, and a first insulating layer overlie the substrate, second contact holes through the first insulating layer, a metal layer over said first insulating layer and filling the second contact holes, and a second insulating layer over said metal layer, said second insulating layer having second vias.

18. The monitor pattern of claim 16 wherein the monitor pattern further comprises a third monitor area wherein the substrate is covered with a pad oxide layer, a field oxide layer, a tungsten silicide layer and a first insulating layer, said first insulating layer having a plurality of third contact holes, a metal layer over said first insulating layer, said metal layer filing said third contact holes, and a second insulating layer over said metal layer, said second insulating layer having a plurality of third vias.

19. The monitor pattern of claim 16 wherein the monitor pattern further comprises a fourth monitor area wherein a pad oxide layer, a tungsten silicide layer and a first insulating layer overlie the substrate, the first insulating layer having a plurality of fourth contact holes, a metal layer over the first insulating layer, said metal layer filing said fourth contact holes, and a second insulating layer over said metal layer, said second insulating layer having a plurality of fourth vias.

20. The monitor pattern of claim 16 wherein the alignment region is cross shaped.

21. The monitor pattern of claim 16 wherein said first contact holes and said first vias have varied spacings between adjacent contact holes and vias whereby proximity effects can be measured.

22. The monitor pattern of claim 16 wherein the spacing between at least two of the first contact holes is about 5 µm whereby proximity effects can be measured.

23. The monitor pattern of claim 16 wherein the spacing between at least two of the first contact holes is about 3.5 µm whereby proximity effects can be measured.

* * * * *